United States Patent [19]
Koopman

[11] Patent Number: 4,789,834
[45] Date of Patent: Dec. 6, 1988

[54] METHOD AND APPARATUS FOR TESTING OF INDUCTION MOTOR OVERLOAD PROTECTION DEVICE

[75] Inventor: Lawrence J. Koopman, Floyd Knobs, Ind.

[73] Assignee: General Electric Company, Louisville, Ky.

[21] Appl. No.: 944,757

[22] Filed: Dec. 22, 1986

[51] Int. Cl.$^4$ .............................................. G01R 31/02
[52] U.S. Cl. .......................... 524/417; 324/158 MG; 324/423; 324/424
[58] Field of Search ........ 324/424, 423, 417, 158 MG

[56] References Cited

U.S. PATENT DOCUMENTS

| | | | |
|---|---|---|---|
| 2,541,121 | 2/1951 | Sparklin | 73/1 |
| 3,924,160 | 12/1975 | Maier et al. | 324/424 X |
| 4,258,325 | 3/1981 | Richardson | 324/417 |
| 4,340,853 | 7/1982 | Braun et al. | 324/51 |
| 4,463,571 | 8/1984 | Wiggs | 62/126 |
| 4,692,939 | 9/1987 | Parsons | 324/421 X |

Primary Examiner—A. D. Pellinen
Assistant Examiner—Morris Ginsburg
Attorney, Agent, or Firm—H. Neil Houser; Radford M. Reams

[57] ABSTRACT

A method and apparatus for testing the operability of an overload protection device for an induction motor, rapidly and without the need to mechanically load the motor output shaft. A rectifier circuit converts a standard AC input power signal to an unfiltered full wave rectified output power signal which is applied to the input terminals of the motor under test to rapidly heat the overload device to its trip temperature. The output power signal is periodically interrupted for brief periods of sufficient duration to extinguish any arcing occasioned by the opening of the overload device contacts. The period between successive interrupt periods is selected to be short enough to extinguish any such arcing before the contacts are damaged. If the contacts of the protection device fail to open within a predetermined time period, a signal is generated to indicate that the overload device has failed to operate properly.

8 Claims, 3 Drawing Sheets

METHOD AND APPARATUS FOR TESTING OF INDUCTION MOTOR OVERLOAD PROTECTION DEVICE

BACKGROUND OF THE INVENTION

This invention relates to a method and apparatus for testing the operability of the overload protection device of an electric induction motor.

Various electrical appliances employ electric motors provided with overload protection devices to protect the motor from overheating. A typical protective arrangement is a thermally responsive switching device with bimetal actuated contacts in series with the motor windings. The device, which is responsive to heat generated in the windings as well as heat generated by motor current through the bimetal device, opens the contacts when the bimetal temperature exceeds a predetermined temperature limit. During the manufacture of appliances equipped with such motors it is desirable to test the operability of the load protection device. When the motor output shaft is accessible, such testing can be accomplished simply by energizing the motor in normal fashion with a mechanical overload applied to the shaft. Under such conditions the bimetal temperature will rise quickly to the temperature limit and the protection device will trip if it is operating properly. However, in many applications the shaft is inaccessible. For example, in the manufacture of refrigerators the compressor motor is part of a sealed refrigerant system. In such situations it is necessary to create an overload condition by supplying electric current to the motor in such a way that the motor will remain stalled but will consume enough energy to trip the overload device. In order to minimize manufacturing costs a further requirement is that the current be sufficient to cause the device to trip quickly to limit the time required for testing An AC power signal cannot be used for testing because at voltages low enough to keep the motor in its stalled condition, the power consumed is insufficient to trip the device. A DC power signal will heat the device quickly enough, but the back emf created by the windings as the contacts of the protection device begin to open, causes arcing which tends to weld the contacts closed. Half-wave rectified voltage can be used but the time required to generate sufficient heat to trip the device is longer than desirable. For example, with typical refrigerator compressor motors energized by a half-wave rectified line voltage signal, the time required is on the order of 30 seconds, which adds costy delay to the manufacturing process.

In view of the aforementioned shortcomings of the prior art it would be desirable to provide a method of testing the operability of the thermal overload device for induction motors which does not require accessibility to the motor shaft, which is fast, preferably less than 10 seconds, and which does not damage the device.

It is therefore an object of the present invention to provide a method of and apparatus for testing the operability of a thermal overload device for induction motors which applies a powe signal to the motor which keeps the motor in its stalled condition, trips the overload device in less than 10 seconds when the device is operating normally and which prevents the contacts from being welded during the test process.

SUMMARY OF THE INVENTION

The present invention provides a method and apparatus for testing the operability of an overload protection device for an induction motor, rapidly and without the need to mechanically load the motor output shaft. A rectifier circuit converts a standard AC input power signal to an unfiltered full wave rectified output power signal which is applied to the input terminals of the motor under test to rapidly heat the overload device to its trip temperature. Timing means causes periodic interruptions of the output power signal for relatively brief interrupt periods of sufficient duration to extinguish any arcing occasioned by the opening of the overload device contacts. The period between successive interrupt periods is selected to be short enough to extinguish any such arcing before the contacts are damaged. Means are provided for detecting the opening of the overload device contacts and determining if the contacts open within a predetermined time period. If the contacts fail to open within the predetermined time period, a signal is generated to indicate that the overload device has failed to operate properly.

In a preferred form of the invention the duration of the interrupt periods is on the order of 4 to 8 milliseconds; the time between successive interrupt periods is not substantially greater than 60 milliseconds; and the predetermined test period is not substantially greater than 8 seconds.

BRIEF DESCRIPTION OF THE DRAWINGS

Although the novel features of the invention are set forth with particularity in the appended claims, the invention both as to organization and content will be better understood and appreciated from the following detailed description taken in conjunction with the drawings in which:

DETAILED DESCRIPTION

Figure 1:
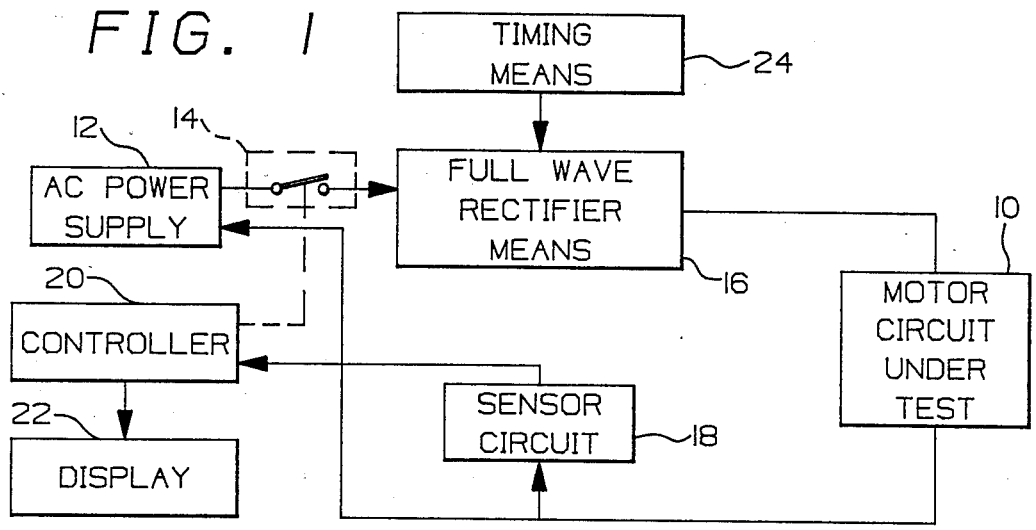
FIG. 1 is a simplified functional block diagram of a test arrangement for testing motor circuits in accordance with the present invention.

The general principles of the invention will be described with reference to the functional block diagram of an arrangement for testing the operability of an overload protection device for an induction motor, shown in FIG. 1. The motor circuit to be tested is represented by Block 10.

Motor circuit 10 includes an AC induction motor equipped with a thermally responsive switching device having contacts in series with the motor windings for overload protection. The contacts are arranged to open when the device temperature exceeds a predetermined temperature limit to protect the motor from thermal damage. As mentioned in the Background discussion it is an object of the invention to provide a test arrangement which will trip a normally operating overload protection device in less than 10 seconds. To this end, in accordance with the present invention, when switch 14 is closed, a full-wave rectified power signal is applied to motor circuit 10 which rapidly raises the temperature of the protective device. However, as the contacts begin to open, the back emf developed by the inductive effects of the motor windings causes arcing at the contacts of the thermally responsive switching device, which if unchecked will weld the contacts.

Timing means 24 generates timing signals effective to periodically interrupt the current from rectifying means 16 for relatively brief interrupt periods of sufficient duration to completely extinguish any arcing occasioned by opening of the overload device. contacts but of sufficiently short duration so as not to unduly prolong the test period. The pulse rate of the timing signal from timing means 24 is adjusted such that the period between successive interrupt periods is short enough to extinguish any arcing initiated during the period before the contacts are damaged.

If the thermal device is operating normally, under the test conditions the contacts will open within a predetermined time period. In a preferred form of the invention, opening of the contacts is detected by sensor circuit 18 which monitors the current supplied to the motor circuit. In the arrangement of FIG. 1, sensor circuit 18. monitors motor circuit current to detect the change in current occasioned by opening of the contacts, and informs the programmable controller 20 that the contacts have opened. The response time of sensor circuit 18 is sufficiency slow that it will not respond to the relatively brief interrupts occasioned by signals from timing means 24.

Controller 20 measures the time from closure of relay switch 14, which initiates the test cycle, until either a signal from sensor circuit 18 is received indicating that the overload switch has tripped or until a predetermined maximum time has timed out. If the sensor signifies that the switch has tripped within the predetermined time period, controller 20 outputs signal to display 22 indicative of motor acceptability. If switch contacts fail to open within the allotted time, the controller opens relay switch 14 and outputs a signal to display 22 indicative of motor overload switch failure.

In the illustrative embodiment hereinafter described with reference to FIG. 2, the motor circuit to be tested is the power circuit for a domestic refrigerator. The object of the test is to determine operability of the overload protection device for the refrigerator compressor motor. This test is conducted as part of the final testing of the fully assembled refrigerator appliance. Thus, the test is conducted by applying power to the complete refrigerator power circuit.

Figure 2:
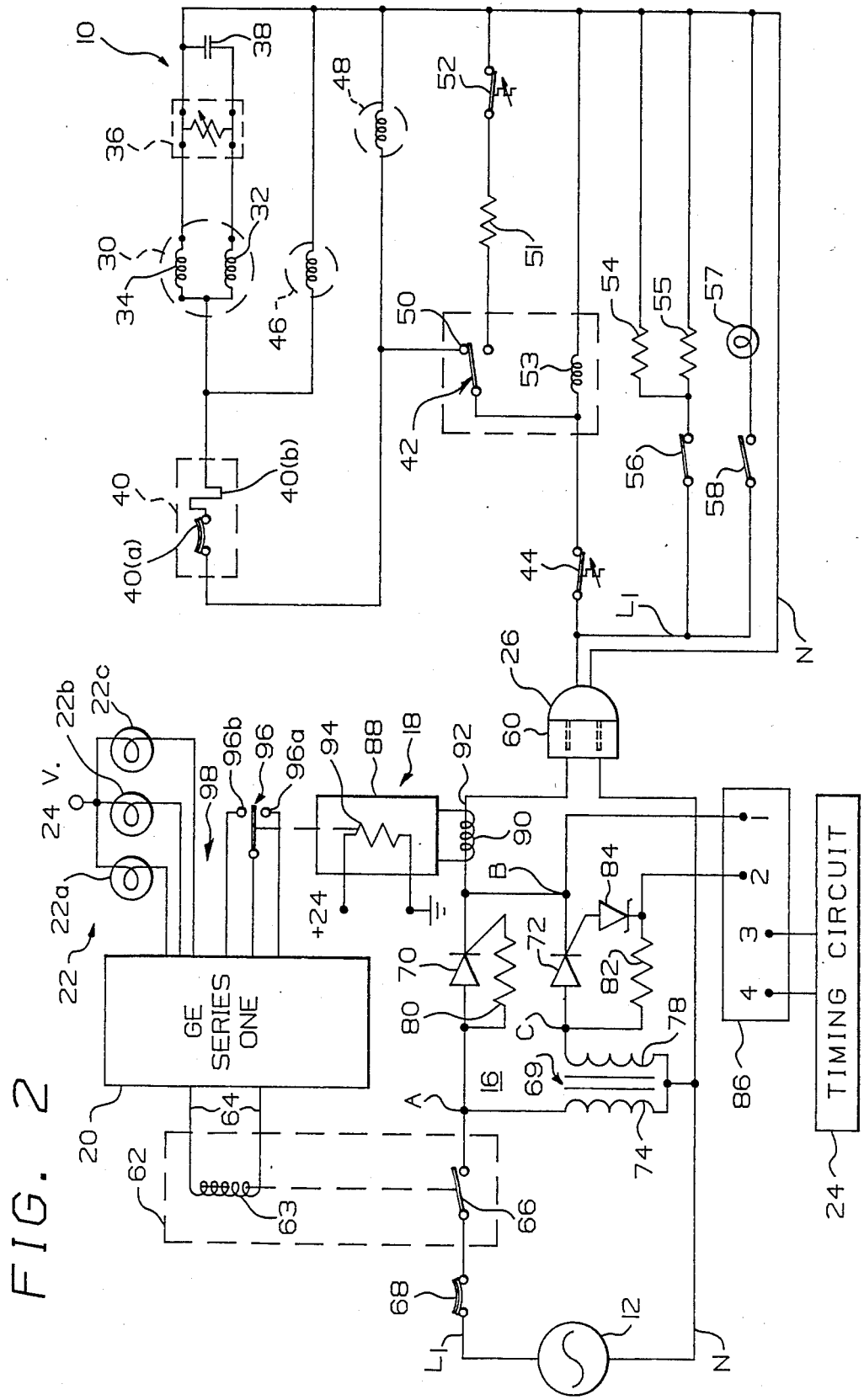
FIG. 2 is a simplified schematic circuit diagram illustratively embodying the test arrangement illustrated in block diagram form in FIG. 1.

Referring now to FIG. 2, the motor circuit, designated generally 10, is a representative refrigerator power circuit. Plug 26 would in normal operation connect lines 11 and N of circuit 10 to a standard 60 Hz, 120 volt AC domestic power receptacle. Of primary interest is the compressor motor portion of circuit 10 which comprises compressor motor 30 including motor start winding 32 and motor run winding 34, a positive temperature coefficient relay switch 36, run capacitor 38, and overload protection switch 40, serially connected between L1 and N via defrost control timer switch 42 and temperature control thermostat 44. Condenser fan motor 46 is connected in parallel with motor 30, relay 36 and run capacitor 38. Th-e purpose of the test is to determine the operability of overload protection switch 40, which comprises bimetal actuated contacts 40(a) and heater 40(b). Bimetal 40(a) is responsive to heat generated by heater 40(b). In addition, the device is mounted to compressor proximate the motor winding such that bimetal is also responsive to heat generated by the motor windings. Overload protection switch 40 in the motor of the illustrative embodiment is Model No. 3ARG1C31 which is one of a family of such devices sold by General Electric Company under the trademark "Guardette". This model has a nominal temperature trip point of 120° C.±5°, and is used as the overload protection device for refrigerator compressor motors having a horsepower rating of 1.4 horsepower.

The rest of the refrigerator circuit includes evaporator fan motor 48 connected between line L1 and N via defrost switch 42 and temperature control thermostat 44; defrost heater 51 which is connected to L1 through defrost timer switch 42 and thermostat 44 and to N through defrost thermostat switch 52; defrost time motor winding 53 which is connected between L1 and N in series with temperature control thermostat switch 44; mullion heater 54 and case heater 55, connected in parallel between N and L1 via manually operated switch 56; and fresh food compartment light 57 which is connected across L1 and N via door actuated switch 58. Defrost timer switch 42 is actuated by a cam (not shown) driven by the defrost timer motor to initiate and terminate the defrost cycle. Defrost timer switch 42 is normally closed across compressor circuit contact 50 as shown, except during defrost cycles.

When connected for testing, plug 26 is connected to test receptacle 60. Power to the test circuit is provided by conventional single phase 120 volt 60 Hz AC power supply 12. Controller 20 initiates and terminates test circuit operation via relay 62. Coil 63 of relay 62 is energized by controller 20 via line 64.

The power signal from supply 12 is coupled to full-wave rectifier means 16 via limiter 68 and relay contacts 66. Rectifier means 16 comprises 120 v to 120 v transformer 69, and SCRs 70 and 72. Primary winding 74 of transformer 69 is connected across L1 and N via ON/OFF relay contacts 66.and limit switch 68. Secondary winding 78 of transformer 69 has one terminal connected to neutral line N phasing transformer 69 to produce 240 volts between terminal A of primary winding 74 and terminal C of secondary winding 78. It will be appreciated that a transformer with a center tapped secondary winding could be similarly employed in the rectifier circuit.

Full-wave rectification is provided by SCRs 70 and 72. SCR 70 has its anode connected to terminal A. SCR 72 has its anode connected to terminal C. The cathodes of SCRs 70 and 72 are commonly connected at terminal B. When both SCRs are turned on, SCR 70 is conductive during positive half cycles (relative to neutral) of the power signal from supply 12, and SCR 72 is conductive during negative half-cycles resulting in an unfiltered full-wave rectified 60 Hz signal at terminal B.

The trigger circuit for SCR 70 comprises resistor 80 connected between its anode and its gate terminal. The value of resistor 80 is selected so as to switch SCR 70 into conduction very early in the positive half-cycles of the line voltage. The trigger circuit for SCR 72 comprises resistor 82 and zener diode 84 serially connected between its anode and gate terminals. The junction between resistor 82 and zener diode 84 is connected to the cathode of SCR 72 via terminals 1 and 2 of solid state switching device 86. The zener voltage and resistance 82 are selected to cause SCR 72 to switch into conduction very early in the negative half-cycles of the line voltage.

Switching device 86 is an AC Output Module designated OAC 5 readily commercially available from Opto 22, Huntington Beach, Calif. Terminals 1 and 2 of device 86 are switched between open and short circuit conditions under the control of timing circuit 24, to control SCR 72. When a short circuit exists between 2 and 1, the current through resistor 82 is shunted around zener diode 84 and SCR 72 is held non-conductive. When an open circuit exists between 1 and 2, gate current is supplied to the gate of SCR 72 switching it into conduction when the voltage across zener diode 84 exceeds its zener voltage. Zener diode 84 is necessary because the short circuit condition between 2 and 1 is provided by a semi-conductor switching device and thus is not a complete short. Zener diode 84 insures that SCR 72 will only switch into conduction when the open circuit condition exists between pins 1 and 2.

Figure 3A:
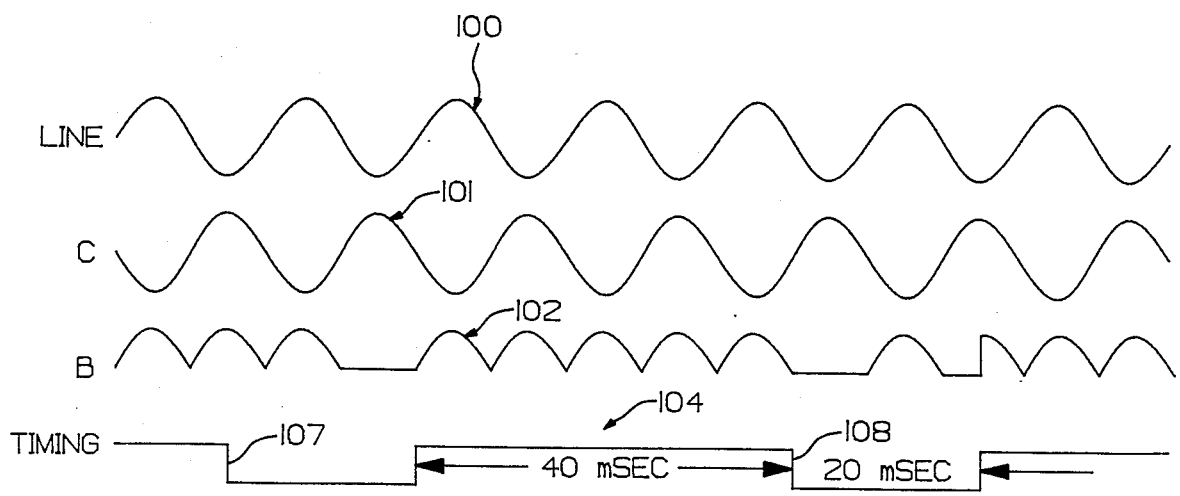
FIG. 3A is a graphical representation of voltage wave forms at specified points in the test circuit of FIG. 1 and a representation of the timing signal for the test circuit.

Voltage wave forms at terminals A, B and C are illustrated in FIG. 3A. Curve 100 represents the 120 volt AC signal appearing between terminal A and neutral line N which essentially corresponds to the line voltage from supply 12. Curve 101 represents the voltage between terminal C and N, which is 180° out of phase with the voltage between A and N. Curve 102 represents the full-wave rectified voltage between point B and N. The blanked and chopped pulses in curve 102 represent periods during which SCR 72 is non-conductive due to shunting of its gate current via switching device 86 under the control of timing circuit 24, to be hereinafter described with reference to FIG. 4.

Referring again to FIG. 2, sensor circuit 18 in the illustrative embodiment comprises a current sensing relay device 88. Relay device 88 includes a current sensing coil 90, positioned to respond to current in line 92, which connects terminal B to line L1 of motor circuit 10, and a relay coil 94, energized by a 24 volt dc supply. Coil 94 controls relay contacts 96 which are connected to input lines 98 to programmable controller 20. Relay device 88 is adapted to switch relay contacts closed across terminal 96(a) signifying to the controller that the motor is drawing current when the current in line 92 exceeds 5 amps, and closed across terminal 96(b) otherwise signifying that overload protection switch 40 has opened. Motor windings 32 and 34 present a very low impedance. Consequently, until the overload protection switch contacts open, motor winding current on the order of 10–15 amps is drawn by the motor circuit. Once the contacts open, the other devices remaining in refrigerator power circuit 10 are of relatively high impedance causing the current to drop to a level on the order of 2-3 amps or less.

Figure 4:
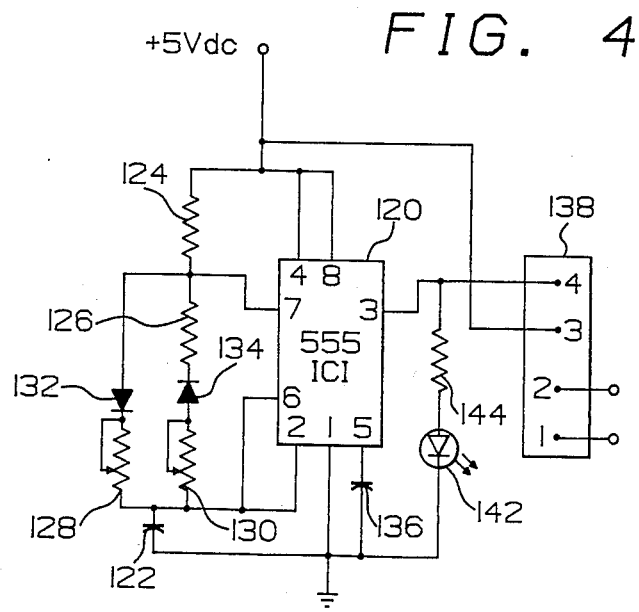
FIG. 4 is a schematic circuit diagram showing details of the timing circuit shown in block diagram form in FIG. 2.

Referring now to FIG. 4, timing circuit 24 will be described in greater detail. Circuit 24 comprises a 555 integrated circuit or chip 120 configured for astable operation, with the trigger input (pin 2) and the threshold input (pin 6) tied together to sense the voltage on capacitor 122 connected between these pins and ground. The circuit is energized by a 5 volt dc supply directly connected to pins 4 and 8. The timing is provided by an external RC network comprising capacitor in combination with fixed resistors 124 and 126, trim potentiometers 128 and 130, and diodes 132 and 134. Resistor 124, diode 132 and trim pot 128 connect the dc supply to capacitor 122, with diode 132 biased to provide a charging path for capacitor 122 Resistor 126, diode 134 and trim pot 130 connect capacitor 122 to discharge pin 7 with diode 134 biased to provide a discharge path for capacitor 122. Pin 1 is connected directly to ground. Modulation pin is connected to ground via bypass capacitor 136 to prevent pick-up of stray signals. The output timing siqnal appears at output pin 3.

The signal is high when capicitor 122 is charging and low when capacitor 122 is discharging. Thus, the pulse width is adjusted by adjusting trim pot 128 and the repetltion rate or period between pulses is adjusted by adjusting trim pot 130. Curve 104 of FIG. 3A represents the timing signal at pin 3.

LED 142 is connected between output pin 3 of chip 120 and ground via current limiting resistor 144 to provide a visual indicator of the status of the circuit. LED 12 will provide a flickering display when timing circuit 24 is woking properly.

It has been empirically determined that a minimum interrupt time on the order of 4 milliseconds is sufficient to extinguish arcing at the contacts of the thermal switch for the illustrative embodiment. It has also been empirically determined that arcing at the contacts can be tolerated for up to 60 milliseconds without sustaining serious damage to the contacts. However, in order to satisfactorily avoid damage the time between interrupt periods should be not substantially greater than 60 milliseconds. In order to minimize the effect of the interrupt periods on the time required for the motor to reach the trip point temperature, it is desirable that the duration of the interrupt period be not substantially greater than 8 milliseconds corresponding to one-half cycle of the 60 Hz power signal.

Timing circuit 24 is not synchronized with power supply 12. Consequently, a duty cycle for the timing circuit must be selected which insures that the time between interrupts will not exceed 60 milliseconds and that the minimum interrupt period is not substantially less than 4 milliseconds.

As will be hereinafter explained with reference to FIGS. 3A and 3B, this requirement is met in the illustrative embodiment by adjusting trim pots 128 and 130 to provide a pulse width of approximately 40 milliseconds and a period between pulses of approximately 20 milliseconds. Referring first to FIG. 3A, curve 102 represents the voltage at point B (FIG. 2). Curve 104 represents the timing signal at pin 3 of chip 120 (FIG. 4). When the timing signal is high, an essentially open circuit condition exists between pins 1 and 2 of module 86. When pin 3 is low a short circuit condition exists between pins 1 and 2. Thus, when signal 104 is low, no gate curent reaches SCR 72 and it remains non-conductive.

Curves 104 and 102 in FIG. 3A represent the relationship between the timing signal and the power signal respectively which provides the minimum period between interrupts and the minimum duration of the interrupt period for the duty cycle of the illustrative embodiment. This condition arises when the relationship between the timing signal and the 60 Hz power signal 102 from supply 12 is such that timing signal 104 first goes low at 107, about mid-way through a power cycle in which SCR 72 is forward biased (curve 101). SCR 72 as already been switched into conduction and remains conductive until commutated off at the end of that half-cycle. During the next half-cycle SCR 70 is conductive, and power signal 102 is not affected. During the next half-cycle SCR 72 is forward biased, and the timing signal prevents SCR 72 from switching on. Therefore, current to the motor circuit is blocked by SCR 72 for the full half-cycle. Timing signal 104 goes high just at the zero crossing of the power signal and remains high for 40 milliseconds switching low again at 108 just prior to a positive half-cycle for SCR 72. Signal 104 then remains low for 20 milliseconds. Thus, SCR 72 is switched off for one full half-cycle and a portion of the next forward biased half-cycle.

Figure 3B:
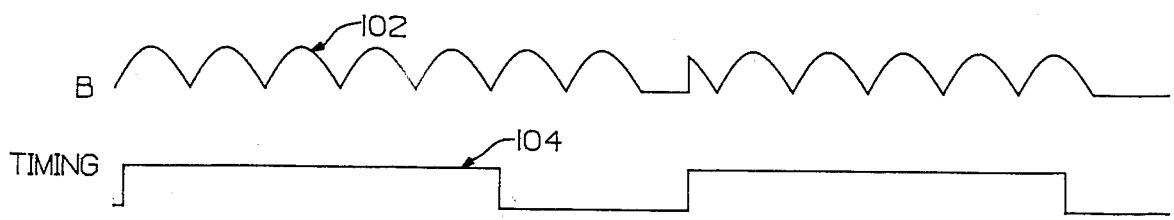
FIG. 3B is a graphical representation of a particular operating condition for the output power signal and the timing signal for the timing circuit of FIG. 4.

The opposite extreme condition for the duty cycle of the illustrative embodiment which provides the maximum time between intervals and the shortest duration of an interrupt period is illustrated in FIG. 3B. This condition occurs when the timing signal goes low just after SCR 72 has switched into conduction as shown for curve 104 in FIG. 3B at 108. SCR 72 will remain conductive for the balance of that half-cycle, SCR 70 will be conductive during the next half-cycle. When SCR 72 is again forward biased the timing signal switches high about 4 milliseconds into the half-cycle, resulting in a time between interrupts of about 56 milliseconds (7 half-cycles) and the duration of the interrupt period is about 4 milliseconds. In actual operation the time between interrupts and the duration will continually vary between these extremes.

Figure 5:
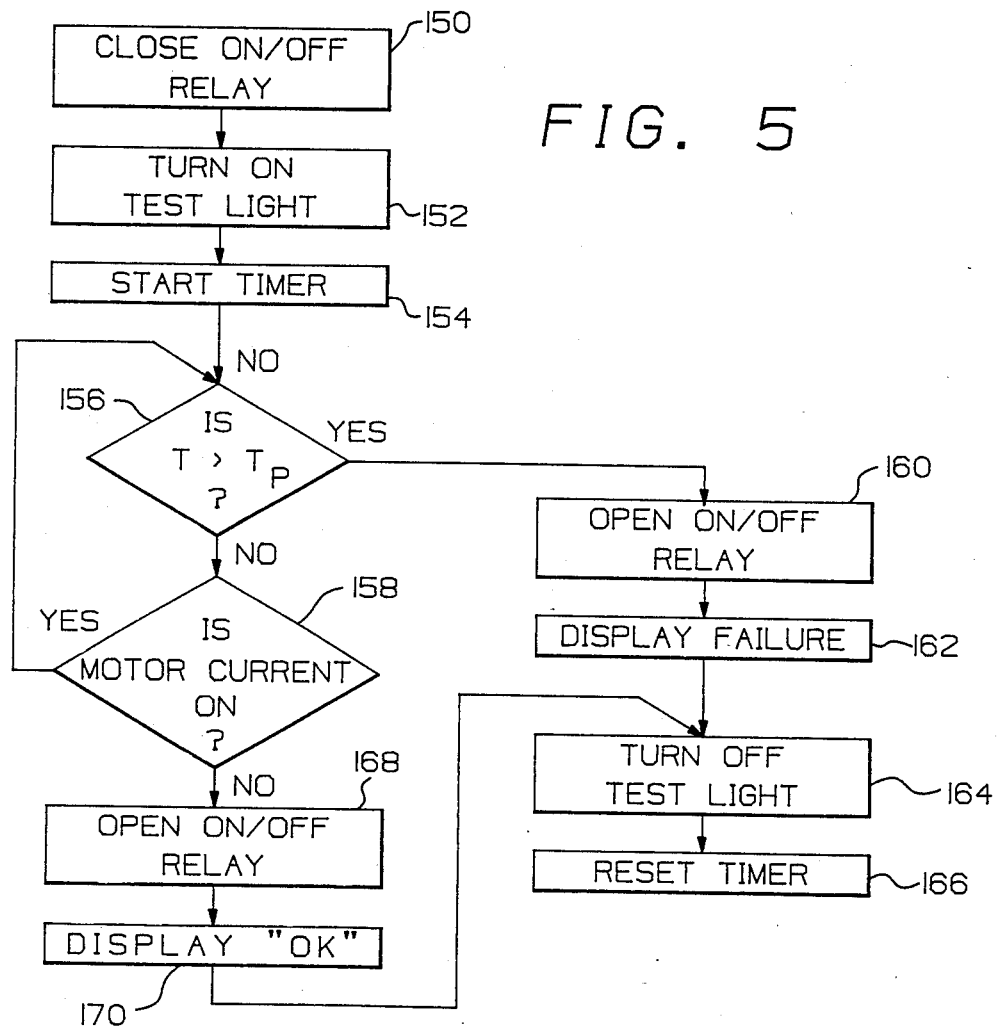
FIG. 5 is a flow diagram of the test program implemented in the programmable controller of FIG. 2 for conducting a test in accordance with the present invention.

In the illustrative embodiment programmable controller 20 is a GE Series One programmable controller. An example control program is illustrated in simplified flow diagram form in FIG. 5. Operation of a test cycle will now be described with reference to the circuit of FIG. 2 and the flow diagram of FIG. 5.

The test cycle begins at Block 150 with the closing of the ON/OFF relay 62 (FIG. 2). Controller 20 outputs a voltage across lins 64, energizing coil 63 which closes normally open relay.contact 66. Next controller 20 turns on test indicator light 22A signifying that the test is in process (Block 152). An internal timer is started (Block 154) to monitor the elapsed time from the initiation of the test cycle.

Controller 20 next checks the timer to see if the elapsed time exceeds a predetermined maximum time (Inquiry 156). Typically, for thermal protection devices of the type herein described, the thermal switch will trip in 3–5 seconds. In the illustrative embodiment the predetermined maximum time is set at 8 seconds. This time has been found sufficiently long to avoid rejecting operative overload protection devices, without damaging the devices or the motors. If the elapsed time has not exceeded the maximum, the controller then checks the state of relay contacts 96 to determine if motor current is flowing (Inquiry 158). It will be recalled that sensor circuit 18 switches relay contacts 96 closed across contacts 96A when the current sensed by coil 90 exceeds 5 amps which only occurs when the compressor motor windings are in the circuit. Controller 20 continues to check the time and the state of the motor current until either the 8 second time period elapses or until the current sensed by sensor 18 drops below 5 amps, indicating that the overload protection device has tripped, whichever first occurs.

In the event the predetermined time period expires before the overload protection switch trips, (a Yes at Inquiry 156), the programmable controller opens the ON/OFF relay circuit by removing the voltage from coil 63 (Block 160), energizes signal light 22B signifying that the thermal device has failed to trip properly (Block 162); turns off test light 22A (Block 164); and resets the internal timer (Block 166).

If the motor current drops below 5 amps before the allowed time has elapsed, (a No at Inquiry 158), the ON/OFF relay is opened by de-energizing coil 63 (Block 168); indicator light 22C is energized signifying that the overload device is acceptable (Block 170); indicator light 22A is turned off (Block 164) signifying the test is completed, and the timer is reset (Block 166) for the next test cycle.

While a specific embodiment of the invention has been illustated and described herein, it is realized that numerous modifications and changes will occur to those skilled in the art. For example, in the illustrative embodiment the timing circuit is not synchronized with the power signal and only one of the SCRs is timer controlled. However, a timer circuit which is synchronized with the power signal could be similarly employed. Furthermore, both SCRs could be timer controlled to provide the desired interrupt periods. It is therefore to be understood that the appended claims are intended to cover all such modifications and changes as fall within the true spirit and scope of the invention.

What is claimed is:

1. A method of testing the operability of an overload protection device incorporated in a power circuit for an AC induction motor having motor power terminals and motor windings adapted for energization by a power signal applied across the power terminals, which device is of the type having contacts in the motor power circuit operative to open thereby de-energizing the motor windings when the device temperature exceeds a predetermined temperature limit, said method comprising the steps of:

applying an unfiltered full wave rectified AC power signal across the motor power terminals to rapidly raise the temperature of the device above the temperature limit;

periodically decoupling the power signal from the motor terminals for a relatively brief interrupt period of sufficient duration to extinguish any arcing occasioned by the opening of the contacts of the overload device, the period between successive interrupt periods being short enough to prevent arc damage to the contacts;

monitoring the motor circuit to detect opening of the overload device contacts;

measuring the time from application of power to the motor terminals; and generating a signal indicating that the overload device has failed the test if the contacts fails to open within a predetermined time interval.

2. The method of claim 1 wherein the duration of each interrupt period is not substantially less than 4 milliseconds and the period between successive interrupt periods is not substantially greeater than 60 milliseconds.

3. The method of claim 2 wherein the predetermined time interval is not substantially greater than 8 seconds.

4. The method of claim 1 wherein the step of monitoring the motor circuit comprises monitoring the current flow in the motor circuit to detect when the contacts open.

5. Apparatus for testing the operability of an overload protection device incorporated in an AC induction motor having motor input terminals and motor windings adapted for energization by a power signal applied to the input terminals, which device has contacts operative to disconnect the motor windings from the motor input terminals when the device temperature exceeds a predetermined temperature limit, said apparatus comprising:

means for converting an AC input power signal to an unfiltered full wave rectified output power signal and applying said output power signal to the input terminals of the motor under test to rapidly raise the overload device temperature above the predetermined temperature limit;

timing means for periodically interrupting said output power signal for relatively brief interrupt periods of sufficient duration to extinguish such arcing as may be occasioned by the opening of the overload device contacts, the period between successive interrupt periods being short enough to extinguish such arcing before the contacts are damaged;

means for detecting the opening of the overload device contacts;

means for determining if the contacts open within a predetermined time period; and means for generating a signal if the contacts fail to open within said predetermined period indicating that the overload device failed to operate properly.

6. The apparatus of claim 5 wherein said interrupt periods are not substantially shorter than 4 milliseconds.

7. The apparatus of claim 6 wherein the time between interrupt periods is not substantially greater than 60 milliseconds.

8. The apparatus of claim 7 wherein said predetermined period is less than 8 seconds.

* * * * *